US009828050B2

(12) United States Patent
Hindle (10) Patent No.: US 9,828,050 B2
(45) Date of Patent: *Nov. 28, 2017

(54) MOBILE POWER SUPPLY TRAILER APPARATUS

(71) Applicant: Hindle Power, Inc., Easton, PA (US)

(72) Inventor: William A. Hindle, Everittstown, NJ (US)

(73) Assignee: Hindle Power, Inc., Easton, PA (US)

( * ) Notice: Subject to any disclaimer, the term of this patent is extended or adjusted under 35 U.S.C. 154(b) by 217 days.

This patent is subject to a terminal disclaimer.

(21) Appl. No.: 14/833,304

(22) Filed: Aug. 24, 2015

(65) Prior Publication Data
US 2016/0107710 A1    Apr. 21, 2016

Related U.S. Application Data

(63) Continuation of application No. 13/694,665, filed on Dec. 21, 2012, now Pat. No. 9,145,082.

(Continued)

(51) Int. Cl.
*H02J 7/00* (2006.01)
*H02J 7/14* (2006.01)
(Continued)

(52) U.S. Cl.
CPC ............ *B62D 63/06* (2013.01); *B60H 1/243* (2013.01); *B60H 1/245* (2013.01); *B60H 1/246* (2013.01); *B60P 3/00* (2013.01); *B60P 3/14* (2013.01); *B60L 1/00* (2013.01); *B60L 3/00* (2013.01); *H01M 2/1005* (2013.01); *H01M 2/12* (2013.01); *H01M 8/00* (2013.01);
(Continued)

(58) Field of Classification Search
CPC ...... H02J 7/00; H02J 7/14; H02J 10/44; H02J 10/46; H05K 7/14; B60L 1/00; B60L 3/00; H01M 2/1005; H01M 2/12; H01M 8/00; H01M 2250/20; Y02T 10/60; Y02T 10/70; Y02T 10/7027; Y02T 10/7038; Y02T 10/7083; Y02T 10/7208; Y02T 30/18; Y02T 90/42; Y02T 90/32; Y02T 90/34; B60P 3/00; B60P 3/14
USPC .................. 320/104, 101; 307/9.1, 10.1, 149
See application file for complete search history.

(56) References Cited

U.S. PATENT DOCUMENTS

9,034,531 B2 * 5/2015 Fabian ................ H01M 8/0273
                                                    429/408
9,145,082 B2 * 9/2015 Hindle ...................... B60P 3/00
(Continued)

*Primary Examiner* — Phallaka Kik
(74) *Attorney, Agent, or Firm* — Design IP (57) ABSTRACT

A mobile power supply housed within a wheeled trailer which can be towed to various locations, particularly remote locations, for providing electrical power as needed for operating equipment or for charging of batteries or other electrical supply devices at such remote locations. The apparatus includes a unique trailer design including venting means for preventing the accumulation of hydrogen normally associated with high power battery operation, particularly charging thereof and therewith, by monitoring hydrogen at all times within the trailer interior and selectively passively and actively venting the interior environment when hydrogen levels are high or whenever necessary. A unique roof design is included for gathering hydrogen near the upper portion of the interior roof construction adjacent to a venting outlet to facilitate expelling thereof.

20 Claims, 10 Drawing Sheets

Related U.S. Application Data (60) Provisional application No. 61/631,740, filed on Jan. 10, 2012.

(51) Int. Cl.
*H05K 7/14* (2006.01)
*B60L 1/00* (2006.01)
*B60L 3/00* (2006.01)
*B62D 63/06* (2006.01)
*B60P 3/00* (2006.01)
*B60P 3/14* (2006.01)
*B60H 1/24* (2006.01)
*H01M 2/10* (2006.01)
*H01M 8/00* (2016.01)
*H01M 2/12* (2006.01)

(52) U.S. Cl.
CPC ............ *H01M 2250/20* (2013.01); *H02J 7/00* (2013.01); *H02J 7/14* (2013.01); *H05K 7/14* (2013.01); *Y02T 10/60* (2013.01); *Y02T 10/70* (2013.01); *Y02T 10/7027* (2013.01); *Y02T 10/7038* (2013.01); *Y02T 10/7083* (2013.01); *Y02T 10/7208* (2013.01); *Y02T 30/18* (2013.01); *Y02T 90/32* (2013.01); *Y02T 90/34* (2013.01); *Y02T 90/42* (2013.01)

(56) References Cited

U.S. PATENT DOCUMENTS

| | | | | |
|---|---|---|---|---|
| 9,522,379 | B2* | 12/2016 | McAlister | B60T 1/00 |
| 2004/0063394 | A1* | 4/2004 | Brenner | B60H 1/008 |
| | | | | 454/75 |
| 2004/0253494 | A1* | 12/2004 | Maruyama | C25B 1/04 |
| | | | | 429/418 |
| 2005/0095470 | A1* | 5/2005 | Harding | H01M 8/04201 |
| | | | | 429/413 |
| 2007/0248848 | A1* | 10/2007 | Marsh | B82Y 30/00 |
| | | | | 429/446 |
| 2010/0209797 | A1* | 8/2010 | Katano | H01M 8/04089 |
| | | | | 429/454 |
| 2013/0101502 | A1* | 4/2013 | McAlister | B60T 1/00 |
| | | | | 423/648.1 |
| 2013/0158828 | A1* | 6/2013 | McAlister | B01J 19/20 |
| | | | | 701/70 |
| 2013/0202988 | A1* | 8/2013 | Wang | H01M 8/04201 |
| | | | | 429/513 |
| 2014/0290595 | A1* | 10/2014 | Owens | F02B 43/10 |
| | | | | 123/3 |
| 2015/0140458 | A1* | 5/2015 | Marsh | B82Y 30/00 |
| | | | | 429/410 |

* cited by examiner

MOBILE POWER SUPPLY TRAILER APPARATUS

BACKGROUND OF THE INVENTION

The present invention deals with the field of power supplies and in particular, large mobile power supplies which can provide a significant amount of electrical power at remote locations wherein such high levels of electrical power are not normally or commonly available. The power supply is housed within a wheeled trailer which can be towed to remote locations for use as needed. Unique circuitry is provided which includes electrical controls for monitoring operation of the power supply including monitoring the accumulation of hydrogen within the interior trailer environment as well as monitoring the power supply parameters from the exterior of the trailer housing using externally viewable control screens.

In the prior art control systems have been designed for monitoring and controlling mobile power supply means which have been patented such as shown in U.S. Pat. No. 2,056,525 patented Oct. 6, 1936 to S. Johnson Jr. et al on a "Trailer Vehicle"; and U.S. Pat. No. 2,649,565 patented Aug. 18, 1953 to D. G. Ihrig on a "Battery Charging Control Responsive To Gas Pressure"; and U.S. Pat. No. 3,090,871 patented May 21, 1963 to C. F. Gorman on a "Battery Charging System"; and U.S. Pat. No. 3,209,675 patented Oct. 5, 1965 to R. H. Stimpson et al on an "Apparatus For Sterile Transportation Of Perishable Liquids"; and U.S. Pat. No. 3,489,320 patented Jan. 13, 1970 to I. A. MacKinnon on a "Device For Spreading Liquid Manure"; and U.S. Pat. No. 3,625,137 patented Dec. 7, 1971 to W. Johnson et al and assigned to Up-Right, Inc. on a "Tank Trailer"; and U.S. Pat. No. 4,337,875 patented Jul. 6, 1982 to D. Lyons and assigned to Atwood Vacuum Machine Company on an "Overflow And Vent Cap For A Container"; and U.S. Pat. No. 5,042,883 patented Aug. 27, 1991 to D. J. McCann et al and assigned to Lucas Industries public limited company on a "Trailer Braking System For A Towing Vehicle"; and U.S. Pat. No. 5,963,013 patented Oct. 5, 1999 to J. L. Watson et al on a "Storage Battery Charging Apparatus And Methods"; and U.S. Pat. No. 6,755,225 patented Jun. 29, 2004 to A. Niedwiecki et al and assigned to Quantum Fuel Systems Technologies Worldwide, Inc. on a "Transportable Hydrogen Refueling Station"; and U.S. Pat. No. 7,683,585 patented Mar. 23, 2010 to B. Johnson and assigned to Yazaki North America, Inc. on "Trailer Battery Charge Systems And Methods"; and U.S. Pat. No. 7,846,570 patented Dec. 7, 2010 to M. Diehl et al and assigned to The Gillette Company on "Venting Water-Tight Battery-Operated Devices"; and U.S. Publication No. 2000010/0295514 published Nov. 25, 2010 to G. Burlak et al and assigned to STMicroelectronics, Inc. on a "Trailer Tow Method For Controlling Charging"; and U.S. Publication No. 2010/0297883 published Nov. 25, 2010 to G. Burlak et al and assigned to STMicroelectronics, Inc. on a "Trailer Tow Preserving Battery Charge Circuit".

SUMMARY OF THE INVENTION

The mobile supply trailer apparatus of the present invention is designed to be attachable for transfer to a powered vehicle such as a truck or other tall vehicle. The apparatus includes a trailer chassis assembly including a trailer frame and a trailer hitch assembly mounted to the trailer frame and adapted to be attached to a powered vehicle such as a truck or the like for facilitating transport thereof. A plurality of wheels are movably mounted to the trailer frame and extends therebelow to facilitate this transport movement.

The apparatus further includes a trailer housing including a trailer floor mounted on the trailer frame and a plurality of trailer walls, preferably a front wall, left wall, right wall and rear wall which extend generally upwardly from the trailer floor. A trailer door opening is defined in the trailer walls and especially defined in the rear wall and includes doors movable extending thereover preferably. A trailer roof is included extending between the individual trailer walls at a position above the trailer floor to define therebetween an interior chamber. Also an uppermost chamber area is defined in the uppermost area of the interior chamber for the purpose of facilitating the gathering of hydrogen gases therein which are lighter than air.

A door assembly is preferably attached to the trailer walls and is selectively positionable between a closed position and an opened position to facilitate access to the interior chamber through the trailer door opening. A plurality of electrical power supplies are positioned within the interior chamber for the purpose of supplying electrical power at remote locations when the trailer is moved to such locations. These electrical power supplies can give off hydrogen gas which the construction of the present invention is designed specifically to accumulate and expel from the interior chamber of the housing.

A permanent ventilation opening is defined in the trailer housing and preferably in the front wall thereof to facilitate movement of ambient air from the external ambient environment into the internal chamber. At least one passive vent is located preferably in the trailer roof area to continuously allow fluid flow from within the interior chamber to exit into the external ambient environment. A hydrogen gas sensing device is positioned within the interior chamber for sensing the concentration of hydrogen gas by volume within the interior chamber. This hydrogen gas sensing means is preferably operative to generate an emergency exhaust signal responsive to sensing a predetermined concentration of hydrogen within the interior chamber.

A hydrogen gas ventilation assembly is included for selectively exhausting of hydrogen gases from the interior chamber into the external ambient environment. This hydrogen gas ventilation assembly is responsive to receiving an emergency exhausting signal from the hydrogen gas sensing device to activate and exhaust hydrogen gases from the interior chamber into the exterior ambient environment. At least one charging status display and control panel is electrically connected to the electrical power supply for monitoring the status and for controlling operations thereof. The charging status display panels are mounted in the trailer walls and are positioned such as to be viewable as well as controllable by a user positioned outside of the trailer wall.

It is an object of the present invention to provide a mobile power supply apparatus wherein all of the power supply equipment necessary to provide power at remote locations is housed within a movable trailer housing which includes wheels.

It is an object of the present invention to provide a mobile power supply apparatus wherein mobility to remote location is enhanced by positioning the power supply apparatus within a trailer housing which can be attached to a vehicle and transported to a remote location for providing power or for any purpose including, but not limited to, charging of remotely located batteries.

It is an object of the present invention to provide a mobile power supply apparatus wherein the level of hydrogen within the interior of the trailer housing can be continuously monitored during operation to prevent excess accumulation of hydrogen.

It is an object of the present invention to provide a mobile power supply apparatus wherein hydrogen monitoring apparatus is included which is operative to activate a ceiling mounted exhaust fan when the level of hydrogen within the trailer housing reaches a level of 1% by volume, and, possibly, also generate an alarm signal.

It is an object of the present invention to provide a mobile power supply apparatus wherein the control apparatus is in electrical communication with a hydrogen sensing device to be operative to cause instantaneous termination of operation of the power supply apparatus if the hydrogen content within the interior environment of the trailer housing reaches a level of 2% or greater by volume.

It is an object of the present invention to provide a mobile power supply apparatus wherein a uniquely designed roof construction is included with contoured panels to enhance accumulation of hydrogen in the upper portion of the interior of the trailer in order enhance exhausting thereof.

It is an object of the present invention to provide a mobile power supply apparatus wherein passive venting is included for continuous monitoring and periodic ventilating of the interior of the trailer compartment which includes outlets located in the roof area and permanent ventilation openings or cutouts located in the lower portion of the trailer housing for maintaining desired ventilation.

It is an object of the present invention to provide a mobile power supply apparatus wherein at least one or more air vents are provided in the side walls of the trailer housing which can be selectively maintained closed and/or opened at any time including during times when power is being supply by the power supply members to facilitate the movement of excessively accumulated hydrogen from of the interior of the trailer housing through the passive vents located in the trailer roof and optionally through the ventilation opening in the roof area with an exhaust fan location therein.

It is an object of the present invention to provide a mobile power supply apparatus wherein a ventilation fan can be included adjacent to the ventilation opening to enhance the exhausting and exiting of hydrogen and/or other gases outwardly therefrom.

It is an object of the present invention to provide a mobile power supply apparatus wherein a uniquely contoured ceiling is included with multiple angularly oriented panels for facilitating the gathering of hydrogen in the upper portion of the interior of the trailer housing immediately adjacent to the passive vents and the ventilation opening to facilitating selective high speed exhausting thereof.

It is an object of the present invention to provide a mobile power supply apparatus wherein a main circuit breaker provides a means to instantaneously terminate or activate all power generation within the power supply.

It is an object of the present invention to provide a mobile power supply apparatus wherein a manually operated ceiling fan control switch is provided to facilitate powering of operation of the ventilation fan located in the ventilation housing adjacent to the ventilation opening in the trailer roof to facilitate ventilation of the interior portion of the trailer to prevent accumulation of high levels of hydrogen within the interior trailer environment.

It is an object of the present invention to provide a mobile power supply apparatus wherein the operation of all of the various parameters and characteristics of the power supply can be monitored by monitoring power supplying display panels and charging operation display panels positioned in the walls of the charging station which face outwardly in order to be viewable from the exterior environment surrounding the outside of the trailer housing.

It is an object of the present invention to provide a mobile power supply apparatus wherein multiple banks of batteries can be included for providing a significant amount of electrical power at remote locations whenever needed.

It is an object of the present invention to provide a mobile power supply apparatus wherein the exterior trailer roof includes a hip roof shaped construction to facilitate gas venting therefrom.

It is an object of the present invention to provide a mobile power supply apparatus wherein various safety devices can be included for protection of users and protection of the mobile power supply apparatus such as an eye wash station or fire extinguishers.

It is an object of the present invention to provide a mobile power supply apparatus wherein interior lights are provided as need for interior maintenance thereof.

It is an object of the present invention to provide a mobile power supply apparatus wherein unique circuitry is provided for controlling the supplying of power to a remote location and the recharging of the power supplies located thereof at any location whether remote or not.

BRIEF DESCRIPTION OF THE DRAWINGS

While the invention is particularly pointed out and distinctly described herein, a preferred embodiment is set forth in the following detailed description which may be best understood when read in connection with the accompanying drawings, in which.

DETAILED DESCRIPTION OF THE PREFERRED EMBODIMENT

The present invention discloses a mobile power supply apparatus housed within a portable trailer 8 to facilitate movement thereof to remote locations for providing power for various purposes including charging batteries at remote locations. The apparatus includes a trailer housing 10 with trailer wheels 12 and a trailer hitch assembly 14 to facilitate movement of the trailer by towing by a powered vehicle such as a truck. The construction of the trailer housing 10 includes a front wall 16, along with a left side wall 18 and a right side wall 20 and a rear wall assembly 17 defining a rear door opening therein with rear doors 22 and 24 selectively extending thereover in a closed position and movable to an opened position to facilitate entry and exit by a user into the interior chamber 48. The left rear door 22 is pivotally secured with respect to the left side wall 18, and the right rear door 24 is pivotally secured with respect to the right side wall 20 to facilitate access to the interior chamber 48 of the trailer housing 10 as needed. A trailer chassis 26 includes a trailer frame 25 which supports the trailer housing 10 and all portions thereof and defines a trailer floor 27 on the upper surface thereof. The trailer roof 32 extends across the upper portion of the trailer side walls 18 and 20 and the front wall 16 and the rear doors 22 and 24.

Battery banks 34 are included within the interior chamber 48 of the trailer housing 10. Such battery banks commonly generate gaseous hydrogen when providing electrical power and during charging thereof, and this hydrogen gas needs to be vented from the interior chamber 48 of the trailer housing 10 to prevent various obvious dangers.

Figure 1:
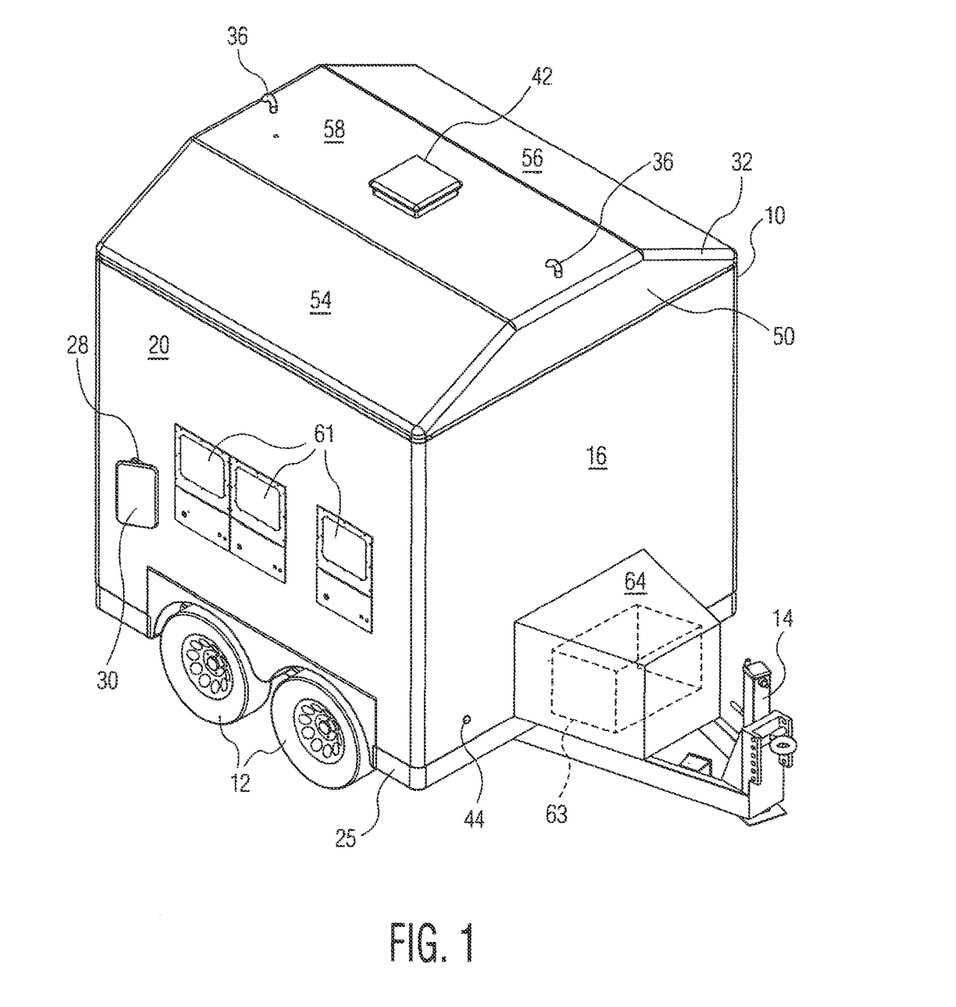
FIG. 1 is a perspective illustration showing a front three-quarter view of the exterior of the mobile power supply apparatus of an embodiment of the present invention viewed from the right front direction.
Figure 2:
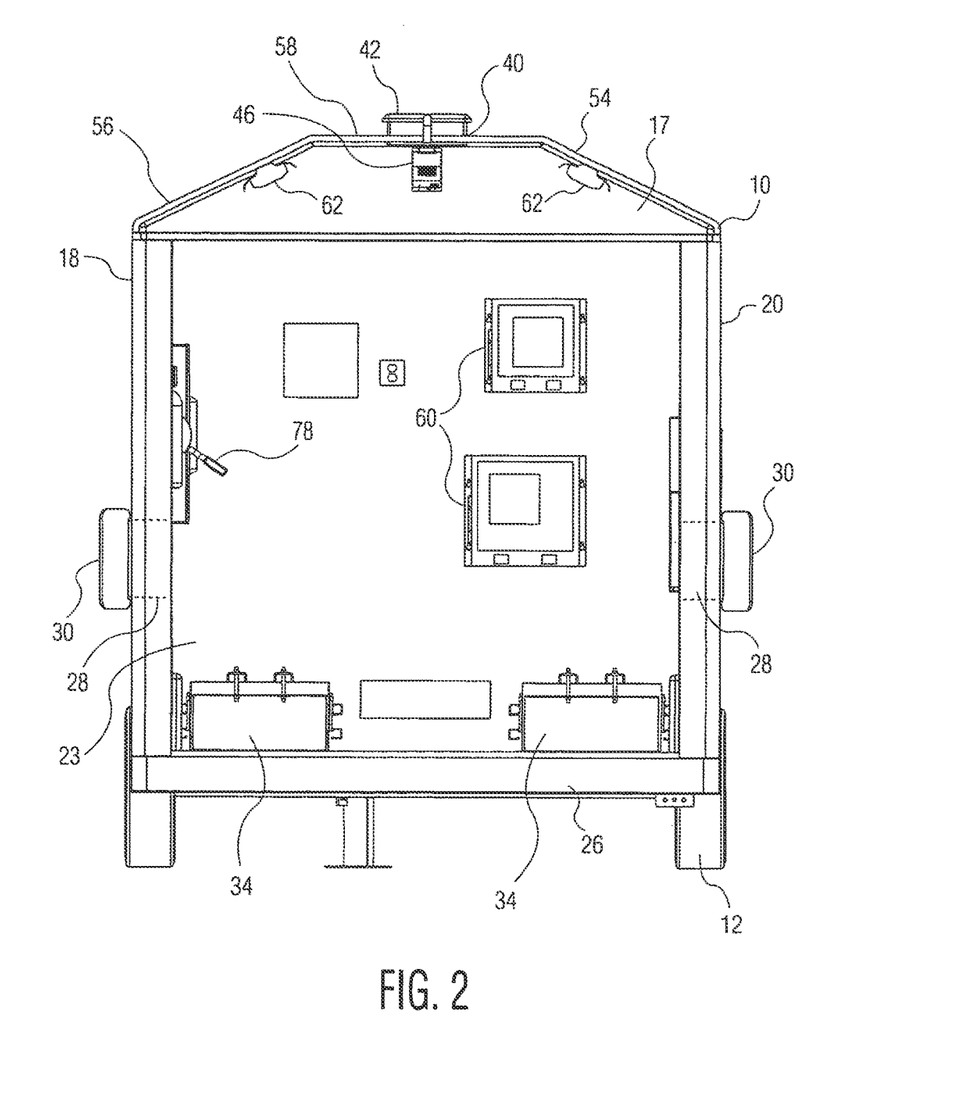
FIG. 2 is a rear plan view of an embodiment of the apparatus shown in FIG. 1 with the rear doors positioned in the opened position.
Figure 3:
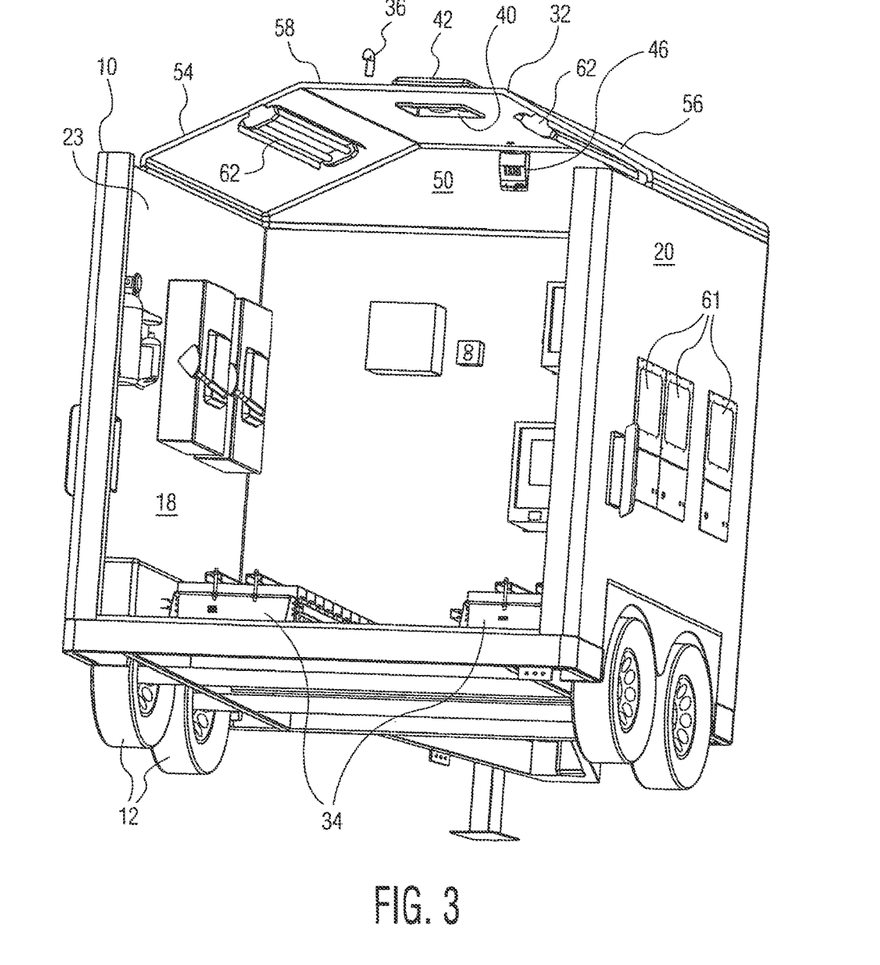
FIG. 3 is a rear perspective illustration of the embodiment shown in FIG. 2 taken from the right back.
Figure 4:
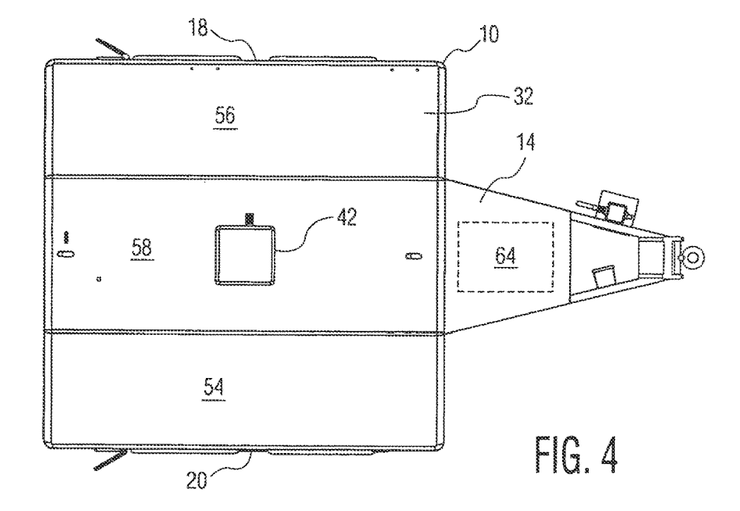
FIG. 4 is a top plan view of the embodiment shown in FIG. 1.
Figure 5:
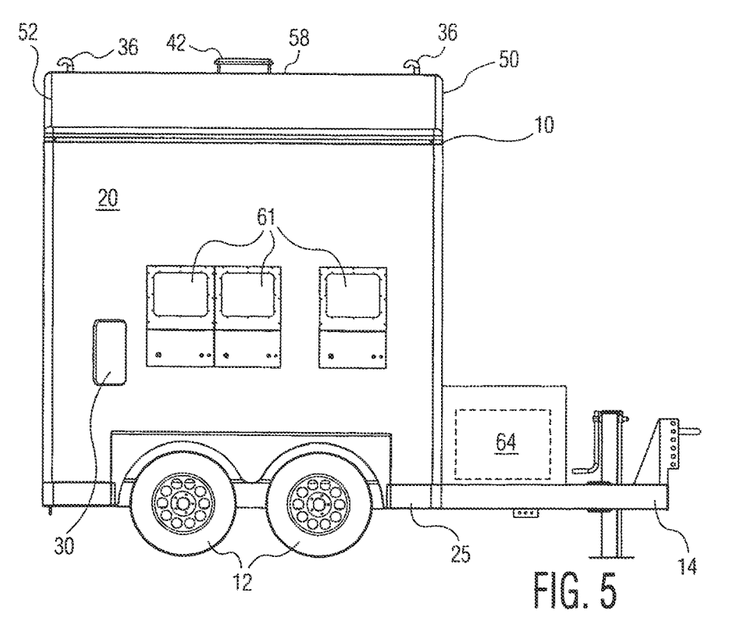
FIG. 5 is a right side plan view of the embodiment shown in FIG. 1.
Figure 6:
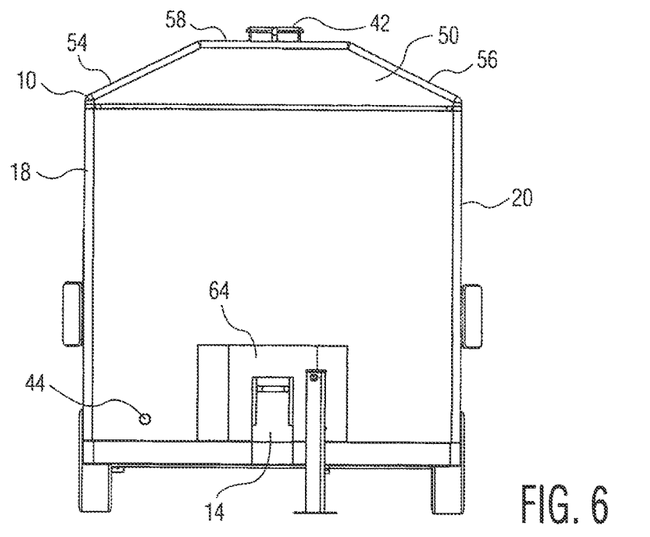
FIG. 6 is a front plan view of the embodiment shown in FIG. 1.
Figure 7:
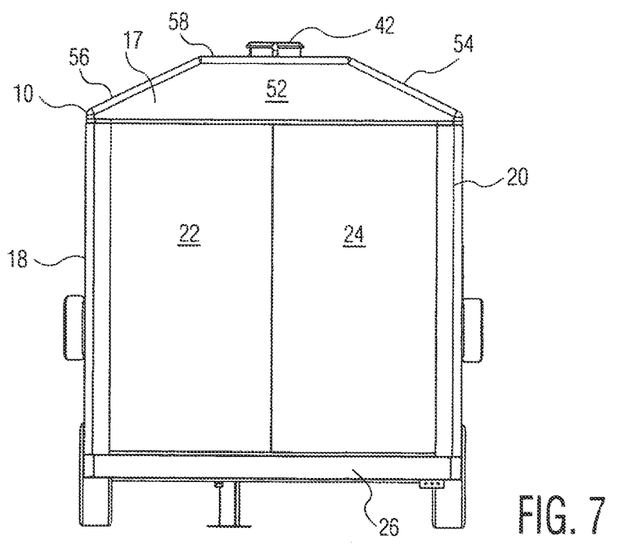
FIG. 7 is a rear plan view of the embodiment shown in FIG. 1 with the rear doors shown in the closed position.
Figure 8:
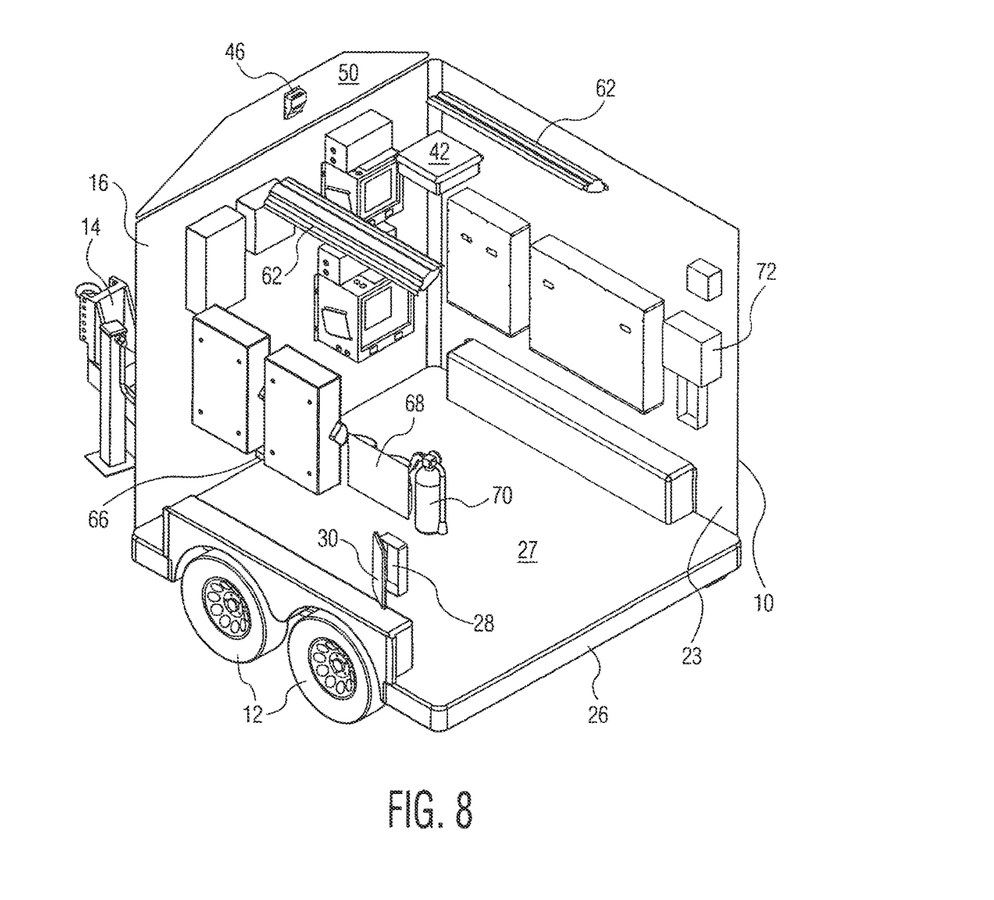
FIG. 8 is a perspective illustration of an embodiment of the mobile power supply apparatus of the present invention showing the apparatus with the roof, left side and rear doors removed to facilitate viewing of the internal components thereof.
Figure 9:
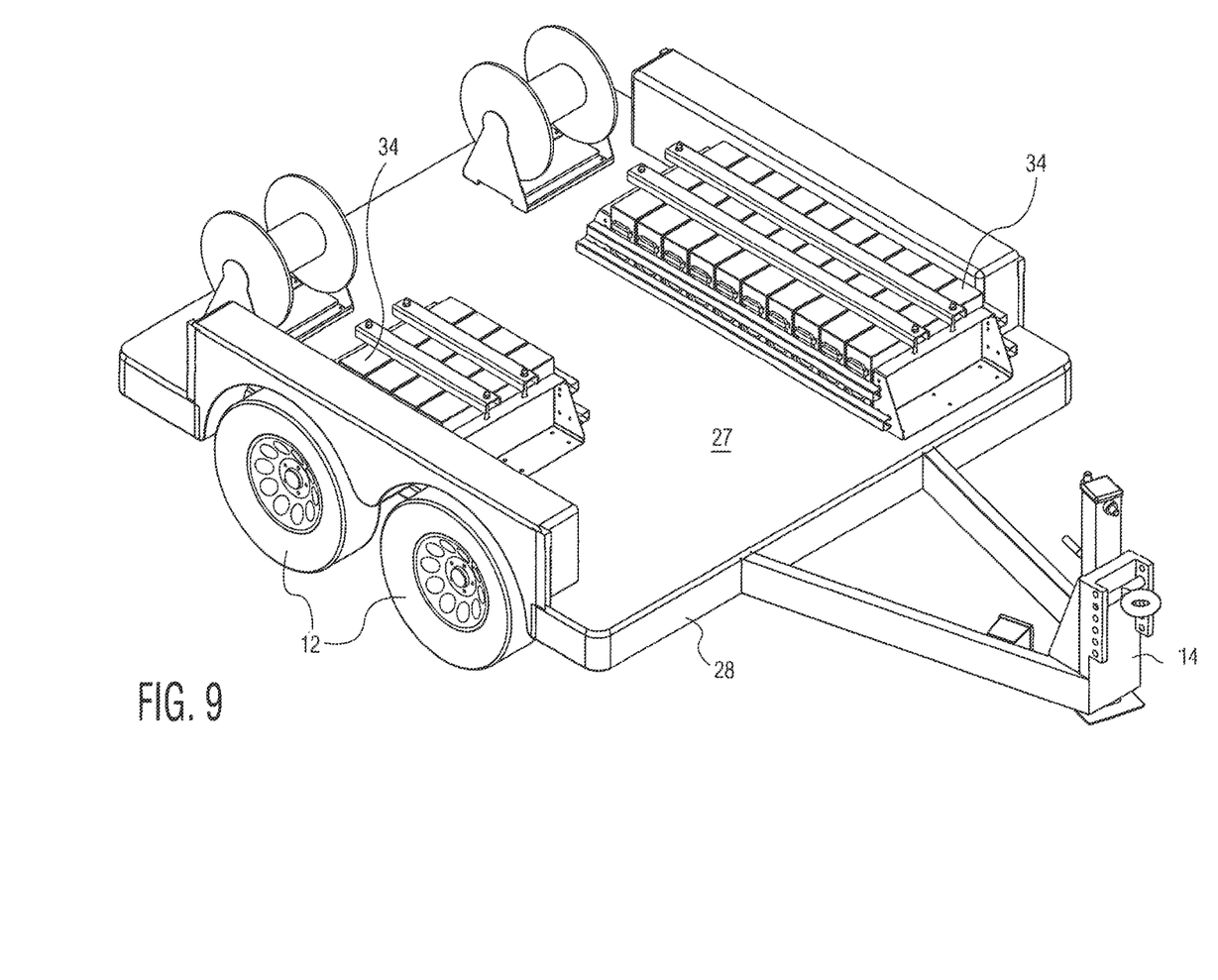
FIG. 9 is a perspective illustration of an embodiment of the chassis construction of the present invention showing the battery packs and cable reels mounted upon the trailer chassis.
Figure 10:
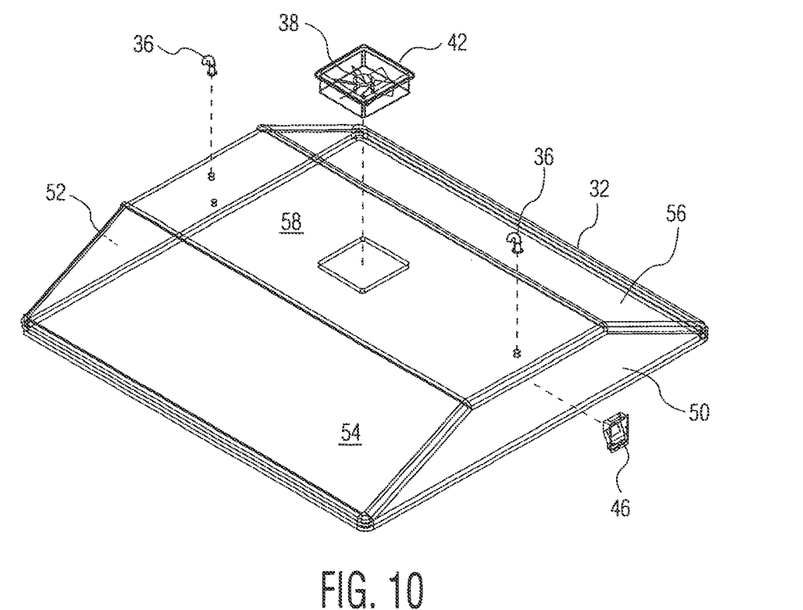
FIG. 10 is a perspective exploded view of an embodiment of the roof construction of the mobile power supply apparatus of the present invention showing the passive vents in the roof and the ceiling blower construction.
Figure 11:
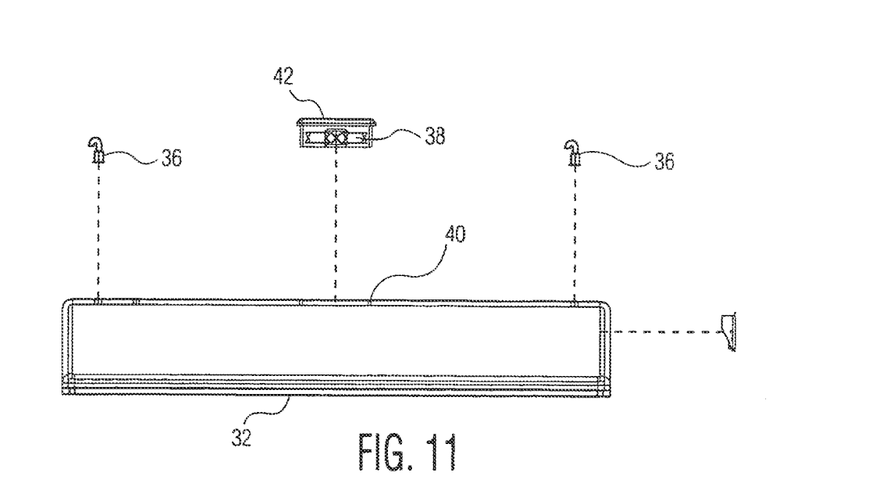
FIG. 11 is a side plan view of the exploded view of the roof shown in FIG. 10.
Figure 12:
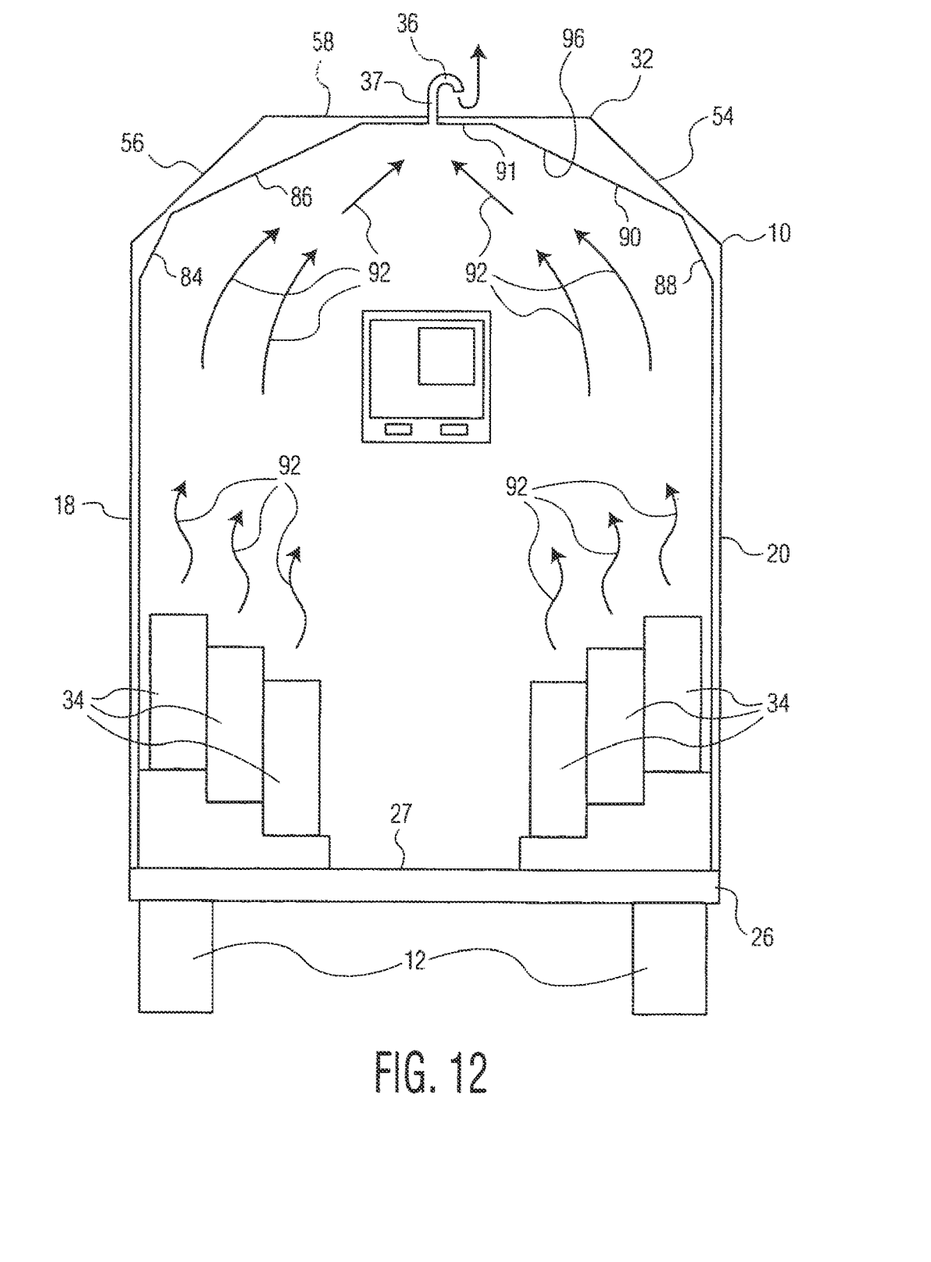
FIG. 12 is a rear plan view showing the positioning of the battery banks and including a schematic illustration of the path of movement of gases such as hydrogen and the like generated by the battery banks during operation of the mobile power supply apparatus of the present invention as it is gathered by the unique roof construction for exhausting from the trailer housing interior.

For this purpose, continuous venting of the interior chamber 48 of the trailer housing 10 is provided by a permanent ventilation opening or cut out 44 shown in this embodiment defined in the front wall 16. It should be appreciated that this permanent ventilation opening 44 can be defined anywhere in the trailer housing 10, but preferably is located in the lower portion thereof near the battery banks 34 to facilitate continuous venting thereadjacent and to enhance continuous ventilation when the trailer housing 10 is being transported due to the increased airflow therethrough due to the normal movement of the trailer housing 10 in the forward direction. The trailer roof 32 will define passive vents 36 which are continuously open and are preferably defined in the upper portion of the roof area to facilitate continuous venting of the interior of the trailer housing 10. Since hydrogen gas is lighter than air, the exhausting of this unwanted gas is at least partially achieved by this passive venting system. As such, a small amount of air will continuously enter the permanent ventilation opening or openings 44, especially while the trailer 8 is being transported, to allow venting of the interior environment of the trailer housing 10 by movement of this air and the hydrogen gas upwardly to exit through the passive vents 36 which will be continuously open, preferably. It should be appreciated that the passive vents 36 can be of any of a variety of different constructions such as the vertical opening shown in FIG. 1, or they can be configured as inverted J-shaped or snorkel-shaped conduits 37 as shown in FIG. 12. The use of the snorkel design 37 will aid in preventing of unwanted items from passing from the exterior into the interior of the trailer housing 10 such as water or ice from precipitation or other unwanted external contaminants.

Ventilation is provided by the permanent vent opening 44 and the passive vents 36 are sufficient for exhaust the unwanted gases such as hydrogen under some operating circumstances. However, when heavy duty operation of the mobile power supply apparatus is occurring, it will be necessary to provide enhanced ventilation to prevent the accumulation of hydrogen within the interior environment of trailer housing 10. For this purpose a ceiling fan construction will be included positioned within the trailer roof 32. The trailer roof 32 will define a ventilation opening 40 therewithin with a ventilation housing 42 in direct fluid flow communication preferably mount with respect to the ventilation opening 40. A hydrogen gas ventilation assembly 39 will include a ventilation fan 38 will be positioned within the ventilation housing 42 and will be selectively operable to provide exhausting of the ambient environment within the trailer housing 10. The gas hydrogen is lighter than air and therefore will tend to travel upwardly and the heavier air will gravitate downwardly. The accumulation of gases within the area immediately below the trailer roof 32 is an important aspect of the present invention. The shape of the interior panels of the ceiling within the trailer housing 10 will tend to accumulate this air at a position adjacent to the ventilation opening 40 and adjacent to the passive vents 36 to facilitate exhausting of the hydrogen from the internal environment to a lower safer level as a percentage by volume of the entire interior chamber 48.

Movement of air through the ventilation opening 40 powered by the ventilation fan 38 will be enhanced by providing of one or more air vents 28 in the lower portion of the trailer housing 10. The embodiment shown in the drawings of the present application disclose specifically two air vents 28. One is located in the right side wall 20 and one is located in the left side wall 18. However, it should be appreciated that any number of air vents 28 could be included. These air vents 28 allow the flow of a significant amount of additional air into the interior chamber 48 of the trailer housing 10 at a position adjacent to battery banks 34 for the purpose of enhancing the flow of hydrogen generated by battery banks 34 upwardly toward the passive vents 36 and the ventilation opening 40. Control of the flow of gas through vents 28 needs to be controlled. Thus, it is important that each of the vents 28 be capable of being closed and/or opened as needed. Thus a separate air vent cover 30 will be position adjacent to each vent 28 for selectively being positioned extending thereover for closing thereof as needed. By allowing the flow of a large volume of ambient air into the interior chamber 48 of the trailer housing 10 through the air vents 28, the apparatus of the present invention insures effective venting of unwanted gases such as hydrogen especially during operation of the ventilation fan 38.

One of the important aspects of the present invention is the inclusion of a hydrogen sensing device 46 preferably positioned within the interior chamber 48 of the trailer housing near the trailer roof 32 for monitoring the level of hydrogen within the ambient internal environment of the trailer housing 10 at this location high within the internal area of the trailer housing 10 where the hydrogen will tend to accumulate. Thus, this sensing device 46 will be positioned to sense the highest levels of hydrogen within the interior chamber 48. The hydrogen sensing device 46 is, preferably, electrically wired to ventilation fan 38 in such a manner as to render it operative for exhausting of the upper portion of the interior chamber 48 whenever the percentage of hydrogen sensed by the hydrogen sensing device 46 reaches a certain predefined level which is normally approximately 1% by volume. The hydrogen sensing device 46 is also electrically connected to an alarm means in order to generate an alarm signal to indicate that a 1% level by volume or greater of hydrogen within chamber 48 has been achieved. It can also be operative to indicate that activation of the exhaust ventilation fan 38 has been started which acts as a warning, particularly when a higher concentration of hydrogen is present in chamber 48. It is possible that the hydrogen sensing device 46 can generate an alarm signal that could be audible and/or visible when the level of hydrogen reaches 1% by volume in chamber 48.

The hydrogen sensing device 46 can also operatively connected electrically with respect to the power source for the mobile power supply apparatus to instantly terminate all power supplied thereto responsive to a level of hydrogen sensed by device 46 reaching a predetermined level which commonly would be approximately 2%. Thus if a 2% by volume concentration of hydrogen gas is sensed by the hydrogen sensing means 46, all power for operation of the mobile power supply will immediately be terminated in order to prevent any further generation of hydrogen until the concentration level thereof within chamber 48 in reduced to nonhazardous levels. Hydrogen is extremely dangerous at concentrations greater of approximately 4% and can be highly explosive when reaching concentration levels of 8% to 10%.

The construction of the trailer roof 32 can include multiple panels including a front hip roof side panel 50 and a rear hip roof side panel 52 which define at the upper edges thereof the hip roof contour. A right inclined roof panel 54 will be positioned extending upwardly and inwardly from the right side wall 20, and a left inclined roof panel 56 will be positioned inclined inwardly and upwardly from the left side wall 18. A central flat roof panel 58 will extend from the upper inward edges of roof panels 54 and 56. Preferably, the passive vent or vents 36 will be defined in the central flat roof panel 58, as well as the ventilation opening 40. The central flat roof panel 58 will extend approximately horizontally and will define the uppermost chamber area 94 of the interior chamber 48 of the trailer housing 10 which, thusly, will tend to gather and accumulate hydrogen therein in order to facilitate the venting of hydrogen since hydrogen is lighter than ambient air.

Multiple battery chargers 60 are included in the apparatus of the present invention which can be electrically operative for recharging the battery power packs or for charging of external batteries as needed.

A plurality of charging status display panels 61 can be defined in the walls of the trailer housing 10, and in this embodiment are shown positioned in the left side wall 18 and the right side wall 20. These charging status display panels 61 are positioned in the walls of the trailer housing 10 in such a manner to be viewable by a user located outside of the trailer 8 to provide information on the current status of operation of the mobile power supply apparatus of the present invention without requiring opening of the trailer doors 22 and 24. Interior lights 62 can be provided for lighting the internal portion of the trailer housing 10 as needed. Other emergency and safety devices can be included mounted on the interior walls of the trailer housing 10 such as an eyewash station 68 and/or one or more fire extinguishers 70. A generator housing 64 with a generator 63 mounted therewithin can be mounted in front of the front trailer wall 16 and behind the trailer hitch assembly 14 in order to provide an electrical power by a gas-powered electrical generator as needed for various purposes. A significant portion of the electrical circuitry of the present invention is provided within an electrical controller or control box 72 in order to monitor and control operation of various aspects of the charging apparatus such as the lights, fan and heater controls. An interior heater 66 such as a baseboard heating means can also be provided for comfort or for maintaining proper operation of the electrical apparatus as needed. An electrical input power means 74 is provided shown in the circuit diagram of FIG. 13, as well as a roof fan power switch and thermostat 76 which can be controlled such as to cause the roof or ventilation fan 38 to initiate operation responsive to excessively warm conditions within the ambient environment inside of the trailer housing 10. The main circuit breaker 78 can be provided for initiating or terminating the power to operation of all circuitry within the mobile power supply apparatus.

Figure 13:
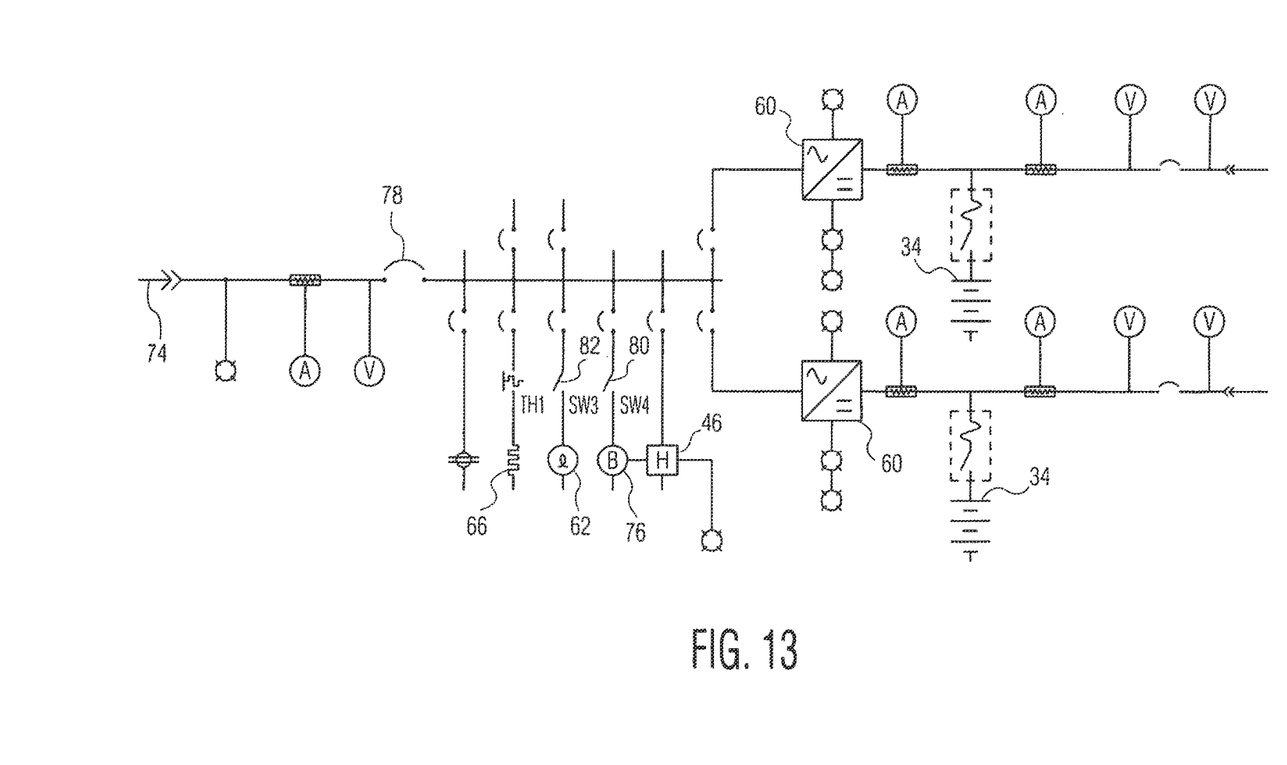
FIG. 13 is a schematic illustration of the operative controls for the mobile power supply apparatus of the present invention.

A manual ceiling fan activation control switch 80 as shown in the circuit diagram of FIG. 13 can be operative to initiate operation of the ceiling fan manually by an operator as need be in case activation of this fan is required when there is not a significant accumulation of hydrogen within the interior of the trailer housing 10 such as to expel an excessive amount of warm air from the chamber 48. Interior light control switch 82 is also included for selectively providing power to the interior lights 62.

An important aspect of the present invention is the specific contour of the uppermost chamber area 94 within interior chamber 48 of trailer housing 10. In particular, the contour defined in the ceiling is defined by the positioning and orientation of the plurality of roof panels, left inclined roof panel 56, right inclined roof panel 54 and central flat roof panel 58 in combination with the front hip roof side panel 50 and the rear hip roof side panel 52.

One configuration which has been shown to be particularly effective is accumulation hydrogen within the uppermost chamber area is shown in FIG. 12 which shows an interior ceiling assembly including a lower left interior ceiling panel 84 extending upwardly from the interior portion of the left side wall 18 and inclined upwardly and inwardly to initiate gathering of the hydrogen toward the vents 36 and 42. This shape will allow the lower left interior ceiling panel 84 to provide the initial stage for accumulation of the hydrogen for exhausting thereof upwardly. An upper left interior ceiling panel 86 will extend upwardly from the upper edge of the lower left interior ceiling panel 84 and will have a greater angular inclination than panel 84 for further guiding of the hydrogen upwardly toward the vents. The left interior ceiling panel 86 will extend completely from the upper innermost edge of first lower left interior ceiling panel 84 to the upper flat interior ceiling panel 91 which is approximately horizontal and is positioned immediately below the central flat roof panel 58. It should be appreciated that it is preferable that all of the passive vents 36 and the ventilation opening 40 will all be defined in both the central flat roof panel 58 and in the upper interior ceiling panel 91 such that full fluid flow communication is provided for gases to exist upwardly from the interior chamber 48. Upper interior ceiling panel 91 will define the uppermost portion of the ceiling such that collection of hydrogen or other unwanted gases will be maximized.

On the opposite side of the uppermost chamber area 94 of trailer 8 a lower right interior ceiling panel 88 will extend upwardly from the interior upper portion of the right side wall 20 and will be inclined upwardly and inwardly therefrom. An upper right interior ceiling panel 90 will be inclined greater than the lower right interior ceiling panel 88 and will extend from the uppermost edge of lower right interior panel 88 to the right side of the upper interior ceiling panel 91. As such, the flow of hydrogen will be guided by this construction of the interior ceiling panels 84, 86, 88 and 90 along the hydrogen flow lines 92 defined in FIG. 12 to enhance movement of hydrogen and/or other unwanted gases to a location immediately adjacent to the upper interior ceiling panel 91 to facilitate exhausting thereof upwardly through the passive vents 36 and to facilitate exhausting through the ventilation opening 40 as powered by the ventilation fan 38, particularly, when the side air vents 28 are not covered by the air vent covers 30 thereby facilitating flow of hydrogen from the interior of the trailer housing 10 along the flow lines 92. As such, the present invention provides a unique apparatus for facilitating the providing of electrical power at remote locations in a mobile power supply apparatus housed within an interior chamber 48 of a trailer 10 wherein all aspects of safety have been directly addressed. An electrical receptacle box 98 is mounted in the trailer wall to and is operatively electrical connected to the battery banks 34 and battery chargers 60 to allow electrical power to flow thereinto or therefrom as needed.

While particular embodiments of this invention have been shown in the drawings and described above, it will be apparent that many changes may be made in the form, arrangement and positioning of the various elements of the combination. In consideration thereof, it should be understood that preferred embodiments of this invention disclosed herein are intended to be illustrative only and not intended to limit the scope of the invention.

The invention claimed is:

1. A mobile power supply trailer apparatus attachable to a powered vehicle to facilitate transport thereof comprising:
   A. a trailer chassis assembly including:
      (1) a trailer frame; and
      (2) a plurality of wheels movably mounted to said trailer frame and extending therebelow to facilitate transporting thereof;
   B. a housing including:
      (1) a floor mounted on said trailer frame;
      (2) a plurality of walls extending generally upwardly from said floor; and
      (3) a roof extending between said walls at a position above said floor to define an interior chamber therebetween and between said walls and defining an uppermost chamber area within said interior chamber for facilitating gathering of hydrogen therein, said roof including a plurality of ceiling panels extending upwardly and inwardly from upper portions of said walls toward a central panel of said roof to define said uppermost chamber as an inward uppermost chamber within said interior chamber disposed proximate said roof central panel;
   C. a hydrogen gas control system for controlling the concentration of hydrogen gas within said housing, said hydrogen gas control system including:
      (1) a first vent defined in said housing to facilitate movement of ambient air from an external ambient environment into said interior chamber;
      (2) a second vent located in said roof proximate said uppermost chamber to allow fluid flow from within said interior chamber to the external ambient environment;
      (3) a hydrogen gas determining device for determining a concentration of hydrogen gas by volume within said interior chamber, said hydrogen gas determining device being operable to determine a predetermined concentration level of hydrogen exists within said interior chamber; and
      (4) a hydrogen gas ventilation assembly for selectively exhausting of hydrogen gases from said interior chamber into the external ambient environment, said hydrogen gas ventilation assembly being responsive to activation according to said hydrogen gas determining device to exhaust hydrogen gases from said interior chamber into the external ambient environment; and
   D. mobile power circuitry including:
      (1) one or more rechargeable portable batteries mounted within said interior chamber;
      (2) power supply circuitry electrically connected to said batteries for providing power to external devices disposed outside of said housing;
      (3) recharging circuitry electrically connected to said batteries for recharging said batteries; and
      (4) at least one charging status control panel electrically connected to said batteries for monitoring status and controlling operations thereof, said at least one charging status control panel being controllable from outside of said housing.

2. A mobile power supply trailer apparatus attachable to a powered vehicle to facilitate transport thereof as defined in claim 1, wherein said hydrogen gas control system is operable to activate said hydrogen gas ventilation assembly to exhaust hydrogen gases from said interior chamber into the external ambient environment when said hydrogen gas determining device determines at least a first predetermined concentration level of hydrogen gas exists within said interior chamber.

3. A mobile power supply trailer apparatus attachable to a powered vehicle to facilitate transport thereof as defined in claim 2, wherein said first predetermined hydrogen gas concentration level includes a level of at least one percent by volume of hydrogen gas being present within said interior chamber.

4. A mobile power supply trailer apparatus attachable to a powered vehicle to facilitate transport thereof as defined in claim 2 wherein said hydrogen gas control system is operative to control operations of said mobile power circuitry responsive to said hydrogen gas determining device determining at least a second predetermined concentration level of hydrogen gas exists within said interior chamber, said second predetermined concentration level of hydrogen gas being a greater concentration by volume than said first predetermined concentration level of hydrogen gas.

5. A mobile power supply trailer apparatus attachable to a powered vehicle to facilitate transport thereof as defined in claim 4, wherein said second predetermined hydrogen gas concentration level includes a level of at least two percent by volume of hydrogen gas being present within said interior chamber.

6. A mobile power supply trailer apparatus attachable to a powered vehicle to facilitate transport thereof as defined in claim 1, wherein said passive second vent comprises a passive vent configured as an inverted curved conduit to minimize the flow of unwanted contaminants therethrough.

7. A mobile power supply trailer apparatus attachable to a powered vehicle to facilitate transport thereof as defined in claim 1, wherein said ceiling panels include:

A. a lower left interior ceiling panel extending upwardly and inwardly from a left side wall to facilitate guiding of hydrogen gas to move upwardly within said uppermost chamber area;
B. an upper left interior ceiling panel extending upwardly and inwardly with respect to said lower left interior ceiling panel to facilitate guiding of hydrogen gas to move further upwardly within said uppermost chamber area;
C. a lower right interior ceiling panel extending upwardly and inwardly from a right side wall to facilitate guiding of hydrogen gas to move upwardly within said uppermost chamber area;
D. an upper right interior ceiling panel extending upwardly and inwardly with respect to said lower right interior ceiling panel to facilitate guiding of hydrogen gas to move further upwardly within said uppermost chamber area; and
E. said central panel formed as an upper flat interior ceiling panel extending approximately horizontally between said upper left interior ceiling panel and said upper right interior ceiling panel, said hydrogen gas ventilation assembly being mounted to and extending through said central panel and being mounted to and extending through said trailer roof to facilitate exhausting of hydrogen gas outwardly therethrough responsive to activation thereof.

8. A method of providing mobile power via an enclosed mobile power supply trailer apparatus while determining and controlling the concentration of hydrogen gas generated therein, the method comprising:
providing a trailer chassis assembly including a trailer frame and a plurality of wheels movably mounted to said trailer frame and extending therebelow;
forming a housing including a floor, a plurality of walls extending generally upwardly from said floor, and a roof extending between said walls at a position above said floor, said floor, walls and roof defining an interior chamber therebetween, said forming including defining an uppermost chamber area within said interior chamber for facilitating gathering of hydrogen therein including arranging ceiling panels extending upwardly and inwardly from said walls toward a central panel of said roof to define said uppermost chamber as an inward uppermost chamber disposed proximate said roof central panel;
arranging a hydrogen gas control system for controlling the concentration of hydrogen gas within said housing including:
 forming a first vent in said housing to facilitate movement of ambient air from an external ambient environment into said interior chamber;
 forming a second vent located in said roof proximate said uppermost chamber;
 providing a hydrogen gas determining device for determining a concentration of hydrogen gas by volume within said interior chamber; and
 configuring a hydrogen gas ventilation assembly for selectively exhausting of hydrogen gases from said interior chamber into the external ambient environment through said second vent; and
providing mobile power circuitry including:
 mounting one or more rechargeable portable batteries within said interior chamber;
 electrically connecting power supply circuitry to said batteries for providing power from said batteries to external devices disposed outside of said housing;
 electrically connecting recharging circuitry to said batteries; and
 providing a charging status control panel in communication with said power supply circuitry, and said hydrogen gas control system, and said recharging circuitry; and
controlling said hydrogen gas ventilation assembly and said mobile power circuitry based on the concentration of hydrogen gas by volume within said interior chamber as determined by said hydrogen gas determining device.

9. The method of providing mobile power via an enclosed mobile power supply trailer apparatus as recited in claim 8, wherein said controlling comprises activating said hydrogen gas control system to exhaust hydrogen gases from said interior chamber into the external ambient environment when said hydrogen gas determining device determines at least a first predetermined concentration level of hydrogen gas exists within said interior chamber.

10. The method of providing mobile power via an enclosed mobile power supply trailer apparatus as recited in claim 9, wherein said at least a first predetermined concentration level of hydrogen gas includes a level of at least one percent by volume of hydrogen gas being present within said interior chamber.

11. The method of providing mobile power via an enclosed mobile power supply trailer apparatus as recited in claim 9, wherein said controlling further comprises controlling said mobile power circuitry to terminate operation of power supply operations when said hydrogen gas determining device determines at least a second predetermined concentration level of hydrogen gas exists within said interior chamber, said second predetermined concentration level of hydrogen gas being a greater concentration by volume than said first predetermined concentration level of hydrogen gas.

12. The method of providing mobile power via an enclosed mobile power supply trailer apparatus as recited in claim 11, wherein said at least a second predetermined concentration level of hydrogen gas includes a level of at least two percent by volume of hydrogen gas being present within said interior chamber.

13. The method of providing mobile power via an enclosed mobile power supply trailer apparatus as recited in claim 8, wherein said controlling comprises controlling said power supply circuitry providing power from said batteries to said external devices circuitry in response to the concentration of hydrogen gas by volume within said interior chamber as determined by said hydrogen gas determining device.

14. The method of providing mobile power via an enclosed mobile power supply trailer apparatus as recited in claim 8, wherein said controlling comprises controlling said recharging circuitry recharging said batteries circuitry in response to the concentration of hydrogen gas by volume within said interior chamber as determined by said hydrogen gas determining device.

15. The method of providing mobile power via an enclosed mobile power supply trailer apparatus as recited in claim 8, wherein said controlling comprises controlling said mobile power circuitry to terminate operation of power supply apparatus in response to the concentration of hydrogen gas by volume within said interior chamber as determined by said hydrogen gas determining device.

16. A mobile power supply trailer apparatus attachable to a powered vehicle to facilitate transport thereof comprising:
a trailer chassis assembly including:

a trailer frame; and
a plurality of wheels movably mounted to said trailer frame and extending therebelow to facilitate transporting thereof;
a housing including:
a floor mounted on said trailer frame;
a plurality of walls extending generally upwardly from said floor; and
a roof extending between said walls at a position above said floor to define an interior chamber therebetween and between said walls and defining an uppermost chamber area within said interior chamber for facilitating gathering of hydrogen therein;
a hydrogen gas control system for controlling the concentration of hydrogen gas within said housing, said hydrogen gas control system including:
a first vent defined in said housing to facilitate movement of ambient air from an external ambient environment into said interior chamber;
a second vent located in said roof proximate said uppermost chamber to allow fluid flow from within said interior chamber to the external ambient environment;
a hydrogen gas determining device for determining a concentration of hydrogen gas by volume within said interior chamber, said hydrogen gas determining device being operable to determine a predetermined concentration level of hydrogen exists within said interior chamber; and
a hydrogen gas ventilation assembly for selectively exhausting of hydrogen gases from said interior chamber into the external ambient environment, said hydrogen gas ventilation assembly being responsive to activation according to said hydrogen gas determining device to exhaust hydrogen gases from said interior chamber into the external ambient environment; and
mobile power circuitry including:
one or more rechargeable portable batteries mounted within said interior chamber;
power supply circuitry electrically connected to said batteries for providing power to external devices disposed outside of said housing;
recharging circuitry electrically connected to said batteries for recharging said batteries; and
at least one charging status control panel electrically connected to said batteries for monitoring status and controlling operations thereof, said at least one charging status control panel being mounted on an exterior of said housing, said at least one charging status control panel being viewable and controllable from outside of said housing.

17. A mobile power supply trailer apparatus attachable to a powered vehicle to facilitate transport thereof as defined in claim 16, wherein said hydrogen gas control system is operable to activate said hydrogen gas ventilation assembly to exhaust hydrogen gases from said interior chamber into the external ambient environment when said hydrogen gas determining device determines at least a first predetermined concentration level of hydrogen gas exists within said interior chamber.

18. A mobile power supply trailer apparatus attachable to a powered vehicle to facilitate transport thereof as defined in claim 17, wherein said first predetermined hydrogen gas concentration level includes a level of at least one percent by volume of hydrogen gas being present within said interior chamber.

19. A mobile power supply trailer apparatus attachable to a powered vehicle to facilitate transport thereof as defined in claim 17 wherein said hydrogen gas control system is operative to control operations of said mobile power circuitry responsive to said hydrogen gas determining device determining at least a second predetermined concentration level of hydrogen gas exists within said interior chamber, said second predetermined concentration level of hydrogen gas being a greater concentration by volume than said first predetermined concentration level of hydrogen gas.

20. A mobile power supply trailer apparatus attachable to a powered vehicle to facilitate transport thereof as defined in claim 19, wherein said second predetermined hydrogen gas concentration level includes a level of at least two percent by volume of hydrogen gas being present within said interior chamber.

* * * * *